United States Patent
Deveau et al.

(10) Patent No.: US 8,063,643 B2
(45) Date of Patent: Nov. 22, 2011

(54) SYSTEM AND METHOD FOR MEASURING BATTERY INTERNAL RESISTANCE

(75) Inventors: Edward Winsor Deveau, Pompano Beach, FL (US); Marc Jeffrey Radzikowski, Deerfield Beach, FL (US)

(73) Assignee: Liebert Corporation, Columbus, OH (US)

( * ) Notice: Subject to any disclaimer, the term of this patent is extended or adjusted under 35 U.S.C. 154(b) by 522 days.

(21) Appl. No.: 12/367,783

(22) Filed: Feb. 9, 2009

(65) Prior Publication Data

US 2009/0224771 A1 Sep. 10, 2009

Related U.S. Application Data

(60) Provisional application No. 61/033,862, filed on Mar. 5, 2008.

(51) Int. Cl.
G01N 27/04 (2006.01)
G01R 31/36 (2006.01)
(52) U.S. Cl. .......................................... 324/430; 702/57
(58) Field of Classification Search .................. 324/430; 702/57
See application file for complete search history.

(56) References Cited

U.S. PATENT DOCUMENTS

| | | | |
|---|---|---|---|
| 4,423,379 A | 12/1983 | Jacobs et al. | |
| 5,744,962 A | 4/1998 | Alber et al. | |
| 6,469,512 B2 | 10/2002 | Singh et al. | |
| 6,519,539 B1 | 2/2003 | Freeman | |
| 6,618,681 B2 | 9/2003 | Hoenig et al. | |
| 6,812,674 B2 | 11/2004 | Hoffman | |
| 7,212,006 B2 | 5/2007 | Huang | |
| 2005/0212489 A1 | 9/2005 | Denning et al. | |
| 2007/0194791 A1 | 8/2007 | Huang | |

FOREIGN PATENT DOCUMENTS

| | | |
|---|---|---|
| EP | 0 544 121 | 6/1993 |
| EP | 1 314 990 | 5/2003 |
| JP | 07-128414 | 5/1995 |
| JP | 2006-105641 | 4/2006 |
| JP | 2008175556 | 7/2008 |
| KR | 100796668 | 5/2003 |
| WO | WO 99/34224 | 7/1999 |

OTHER PUBLICATIONS

International Search Report and Written Opinion for corresponding International Application No. PCT/US2009/035832 dated Dec. 9, 2010.

(Continued)

*Primary Examiner* — Bot Ledynh
(74) *Attorney, Agent, or Firm* — Harness, Dickey & Pierce, P.L.C.

(57) ABSTRACT

In one aspect the present disclosure relates to a system for measuring an internal resistance of a battery. The system may involve: a processor; a load module responsive to the processor for applying a load across the battery; a current sense subsystem for sensing the current flowing to the load module and generating a sensed current signal in accordance therewith; a multiplexer module in communication with the current sense subsystem for detecting voltages with the load coupled across the battery and uncoupled from the battery, and generating voltage signals in accordance therewith; and a filtering and amplification subsystem responsive to the multiplexer module, for filtering and amplifying a level of each of the voltage signals to produce modified voltage signals for use by the processor in determining the battery internal resistance.

20 Claims, 7 Drawing Sheets

OTHER PUBLICATIONS

O'Connor, John; Leonard, Thomas; and Bohensky, Gene. "Comparing Methods To Determine The Health Of Battery Systems", BTECH, Inc., Rockaway, NJ 07866, http://www.btechinc.com/docs/ComparingMethods.pdf, Jul. 7, 2005, 9 Pages.

Leong, Wai Yie. "Smart Battery Monitoring System", Department of Information Technology and Electrical Engineering, The University of Queensland, http://innovexpo.itee.uq.edu.au/2001/projects/s804718/thesis.pdf, Oct. 18, 2001, 77 Pages.

SYSTEM AND METHOD FOR MEASURING BATTERY INTERNAL RESISTANCE

CROSS-REFERENCE TO RELATED APPLICATIONS

This application claims the benefit of U.S. Provisional Application No. 61/033,862 filed on Mar. 5, 2008. The disclosure of the above application is incorporated herein by reference.

FIELD

The present disclosure relates generally to measuring battery internal resistance, and more particularly to a system and method for measuring the internal resistance of a battery and that produces less drain on the battery and accomplishes the resistance measurement more rapidly than previously used measurement systems.

BACKGROUND

The internal resistance of a battery indicates the capacity of the battery to supply power to a load or circuit. The internal resistance may be measured periodically to insure that a battery meets a predetermined state of health (SOH). Based on field testing of various types of batteries, such as lead, lead acid and lead calcium batteries, once the internal resistance increases to more than 25% above its nominal value, the battery is unable to meet its capacity requirements and fails capacity tests.

Referring now to FIG. 1, a schematic model is shown of battery resistance. The model includes a natural capacitance $X_C$, electromechanical resistance $R_E$, and metallic resistance $R_M$. Metallic resistance $R_M$ is in series with a parallel combination of the electromechanical resistance $R_E$ and natural capacitance $X_C$.

Electrochemical resistance $R_E$ represents the internal resistance of the battery and includes a series combination of resistances $R_{PASTE}$, $R_{ELECTROLYTE}$, and $R_{SEPERATOR}$. $R_{PASTE}$ represents a resistance that is presented by cell paste used on metallic grids of the battery. $R_{ELECTROLYTE}$ represents a resistance of electrolytes in the battery. $R_{SEPARATOR}$ represents a resistance of the separators in the battery.

Metallic resistance $R_M$ includes a series combination of resistances $R_{GRID\ TO\ POST}$, $R_{GRID}$, $R_{STRAP}$, $R_{TERMINAL\ POST}$. $R_{GRID\ TO\ POST}$ represents a resistance presented by a junction resistance between a battery post and a metallic grid that connects a plurality of battery cells. $R_{GRID}$ represents a resistance presented by the metallic grid. $R_{STRAP}$ represents a resistance presented by a conducting bar or wire that connects the battery post to a post of another battery. $R_{POST}$ represents a resistance presented by the battery post.

Referring now to FIG. 2, an oscilloscope trace shows an example of battery voltage during an internal resistance test that is performed in accordance with the prior art. The battery voltage is represented by trace 20. A horizontal axis 22 represents time at 100 mS per division. Prior to time 24, the battery voltage is at a float voltage. Float voltage is the battery voltage when the battery is fully charged and unloaded.

At time 24, an electrical load is applied to the battery. The battery voltage drops exponentially to a loaded voltage at time 26. The battery internal resistance can be estimated by $\Delta V/I$, where $\Delta V$ is the difference between the unloaded voltage and the loaded voltage, and I is the battery current. After time 26 the load is removed and the battery voltage recovers to the float voltage. FIG. 2 shows that each iteration of the battery resistance test can take about 400 mS.

SUMMARY

In one aspect the present disclosure relates to a system for measuring an internal resistance of a battery. The system may comprise: a processor; a load module responsive to the processor for applying a load across the battery; a current sense subsystem for sensing the current flowing to the load module and generating a sensed current signal in accordance therewith; and a multiplexer subsystem in communication with the current sense subsystem for detecting voltages with the load module coupled across the battery and released from the battery, and generating voltage signals in accordance therewith; and a filtering and amplification subsystem responsive to the multiplexer subsystem, for filtering and amplifying a level of each of the voltage signals to produce a pair of modified voltage signals for use by the processor in determining the internal battery resistance of the battery.

In another aspect the present disclosure relates to a system for measuring an internal resistance of a battery. The system may comprise: a processor; a load module responsive to the processor for applying a load across the battery; a current sense subsystem for sensing the current flowing to the load module and generating a sensed current signal in accordance therewith; and a multiplexer module in communication with the current sense subsystem for detecting voltages across the load module and generating a pair of voltage signals in accordance therewith, one with the load coupled across the battery and one without the load coupled across the battery; and a level shifting, filtering and amplification subsystem responsive to the multiplexer module and the current sense subsystem that filters the voltage signals to reduce a bandwidth of each of the voltage signals, to thus produce reduced bandwidth voltage signals; level shifts the reduced bandwidth voltage signals to produce level shifted voltage signals; and amplifies the level shifted voltage signals to produce a pair of modified voltage signals, and wherein the modified voltage signals form an amplified portion of a voltage step of the level shifted voltage signal as the battery recovers after the load has been applied to the battery.

In still another aspect the present disclosure relates to a method for measuring an internal resistance of a battery. The method may comprise: applying a load across a pair of terminals of the battery; sensing a current flowing through the load and generating a sensed current signal in accordance therewith; measuring a change in voltage across the battery to produce a voltage signal; filtering the voltage signal to produce a reduced bandwidth voltage signal; level shifting the reduced bandwidth voltage signal to produce a shifted voltage signal; amplifying the shifted voltage signal to produce an amplified voltage signal; and using the amplified voltage signal and the sensed current signal to calculate the internal resistance of the battery.

BRIEF DESCRIPTION OF THE DRAWINGS

The drawings described herein are for illustration purposes only and are not intended to limit the scope of the present disclosure in any way.

DESCRIPTION

Figure 1:
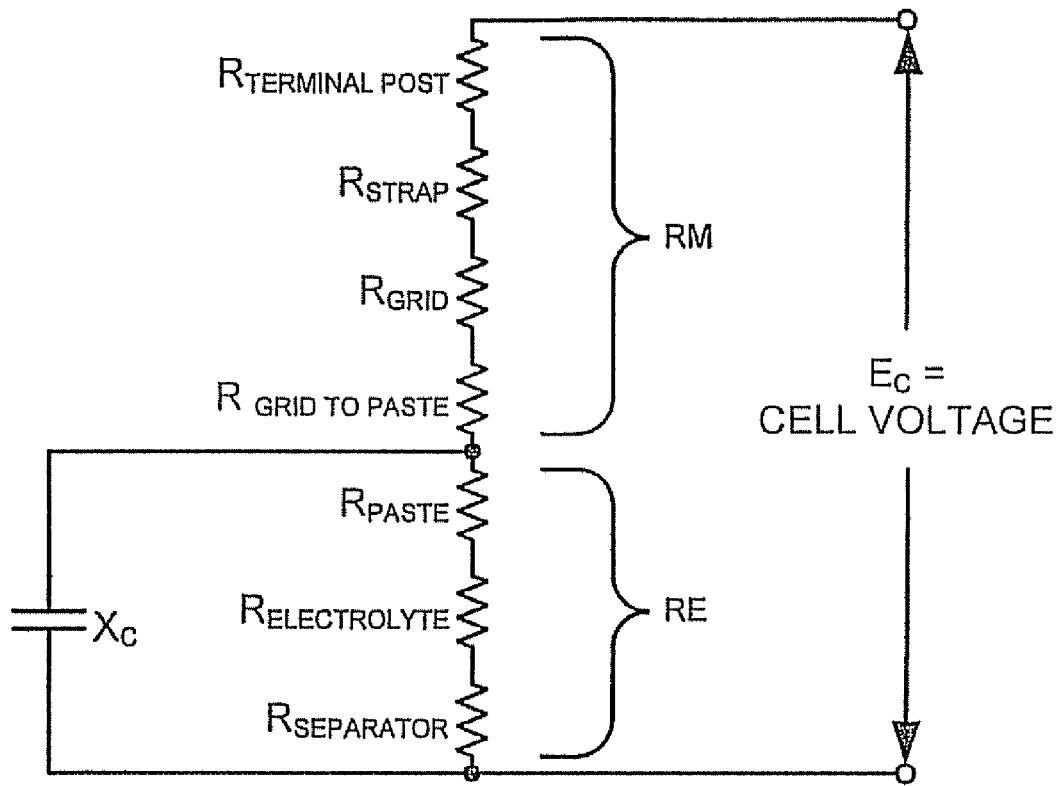
FIG. 1 is a schematic model is shown of battery resistance of a typical prior art battery.
Figure 2:
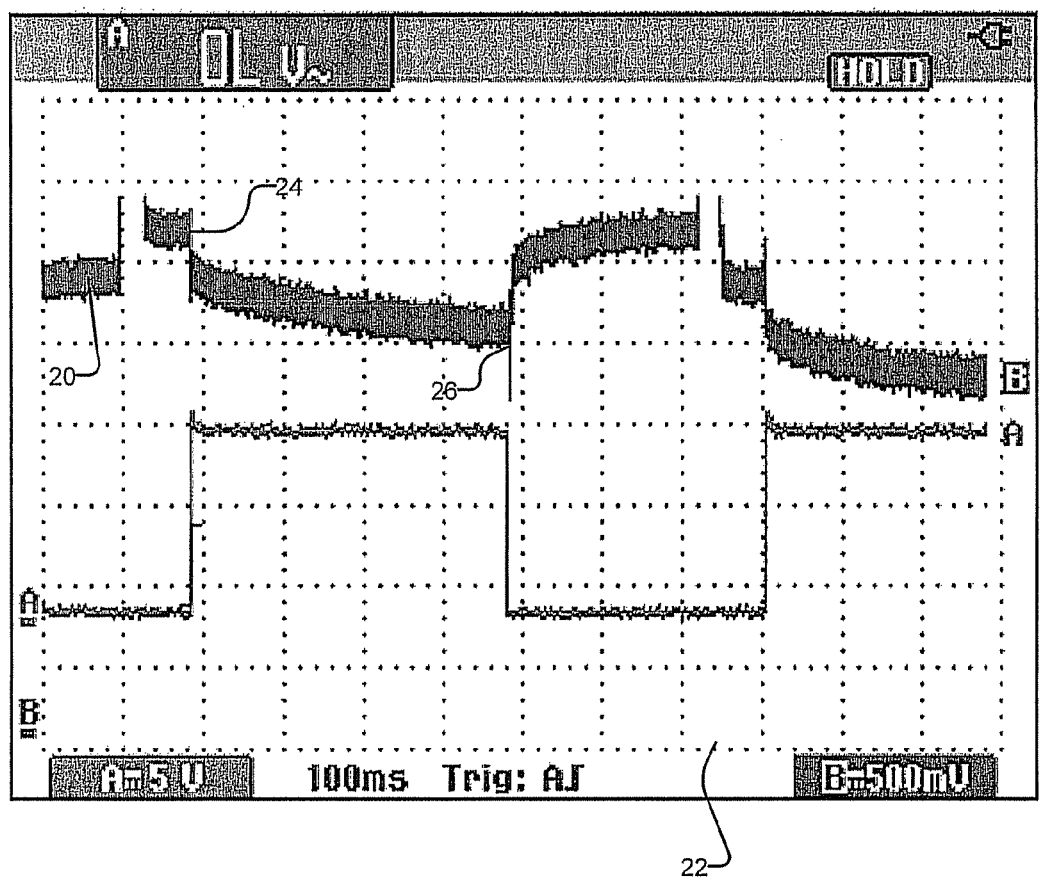
FIG. 2 is an oscilloscope trace that shows an example of battery voltage during an internal resistance test that is performed in accordance with the prior art.
Figure 3A:
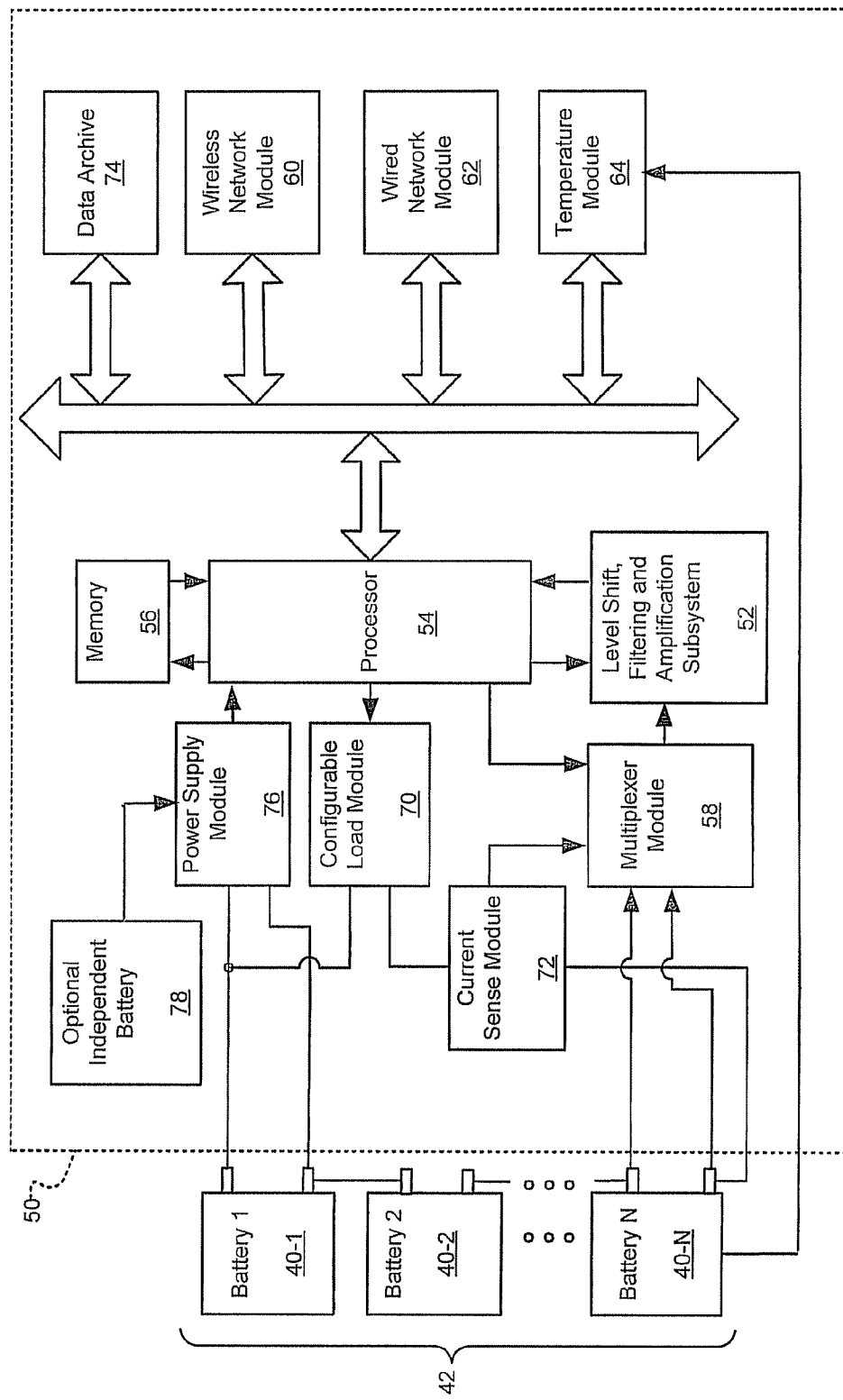
FIG. 3A is a block diagram of one embodiment of a battery tester in accordance with an aspect of the present disclosure.

Referring now to FIG. 3A, a functional block diagram is shown of one embodiment of a battery tester 50 in accordance with an aspect of the present disclosure. Battery tester 50 may employ a level shifting, filtering and amplification module 52. For convenience this component will be referred to through simply as the "amplification module" 52, with it being understood that the amplification module 52 performs more than just an amplification function. The amplification module 52 also may include a high speed analog-to-digital conversion (A/D) module 52a. The speed of the amplification module 52 allows battery tester 50 to exploit a property of batteries to perform battery resistance tests faster than is possible with prior art systems.

In FIG. 3A batteries 40-1, . . . , 40-N are illustrated and referred to collectively for convenience as simply "batteries 40". Batteries 40 are connected in series to form a battery string 42. Battery 40-N is shown connected as the battery under test; however it should be appreciated that any of batteries 40 can be the battery under test.

Battery tester 50 may include a processor 54. Processor 54 communicates with a computer-readable memory 56. Memory 56 may store instructions that are executed by processor 54. The instructions may implement a method of controlling a load that is applied to the battery under test 40-N, reading battery current and battery voltages via a multiplexer (MUX) module 58 and the amplification module 52, and calculating the battery internal resistance of the battery under test 40-N based on the readings.

Processor 54 may communicate readings and battery resistance estimates via at least one of a wireless network module 60 and a fiber optic or wired network module 62. Alternatively, such information may be stored in a data archive 74 that optionally includes a removable memory for subsequent analysis at a later time. Processor 54 may read a temperature of the battery under test 40-N via a temperature module 64. Temperature module 64 may include a thermocouple or thermistor that provides an electrical signal indicative of the temperature of the battery under test 40-N.

A configurable load module 70 may be used to selectively apply a load to battery string 42. Load module 70 can include a plurality of load resistors that are selectively connected in parallel across battery string 42, or just across a subset of one or more individual batteries of the battery string 42, by suitable control signals from the processor 54. More specifically, the loads can be switched by transistors or other suitable switching elements that are controlled by the processor 54 so that a specific, desired load may be coupled across the battery string 42. In one aspect the load module 70 may include a 4 ohm load, a 3 ohm load, and a 0.3 ohm load that are switched by transistors or other suitable switching elements. However the load module 70 may include a greater or lesser number of switchable loads, and the specific resistance values of 4, 3 and 0.3 ohms are merely exemplary, as other resistance loads could be employed to meet the needs of a specific application. Processor 54 may select the load combination based on a table that is stored in memory 56. The table may indicate which load(s) to switch on for a particular combination of battery voltages and number of batteries 40 in battery string 42. The battery tester 50 further may include a current sense module 72 that generates a signal that represents the amount of current flowing through battery string 42. Current sense module may include a 0.01 ohm shunt resistor that provides the signal to multiplexer module 58. In one example, the 0.01 ohm shunt resistor may have a 1.0% initial tolerance and a 75 ppm/° C. temperature coefficient. In one example the application time duration during which the shunt resistor is coupled across the battery string 42 is limited to about 50 ms, and more preferably is limited to a pulse of about 10 ms in duration.

Multiplexer module 58 selectively couples one of a plurality of signals to an input of A/D module 52. The signals at the input of multiplexer module 58 include the voltages of the battery under test, obtained under loaded and unloaded conditions, and the signal from current sense module 72. If multiplexer module 58 is not used then two A/D modules 52 may be employed to respectively digitize the battery voltage signals and the signal from current sense module 72.

A power supply module 76 may be used to condition power from battery string 42 to power the various components of the battery tester 50. For convenience, the connection lines from the power supply module 76 to the various components of the battery tester 50 have been omitted. Optionally, an independent battery 78 may be included in the battery tester 50 to provide power to the power module 76 for powering the various components of the battery tester. This would eliminate the need to obtain power from the battery string 42 to power the components of the battery tester 50.

Figure 3B:
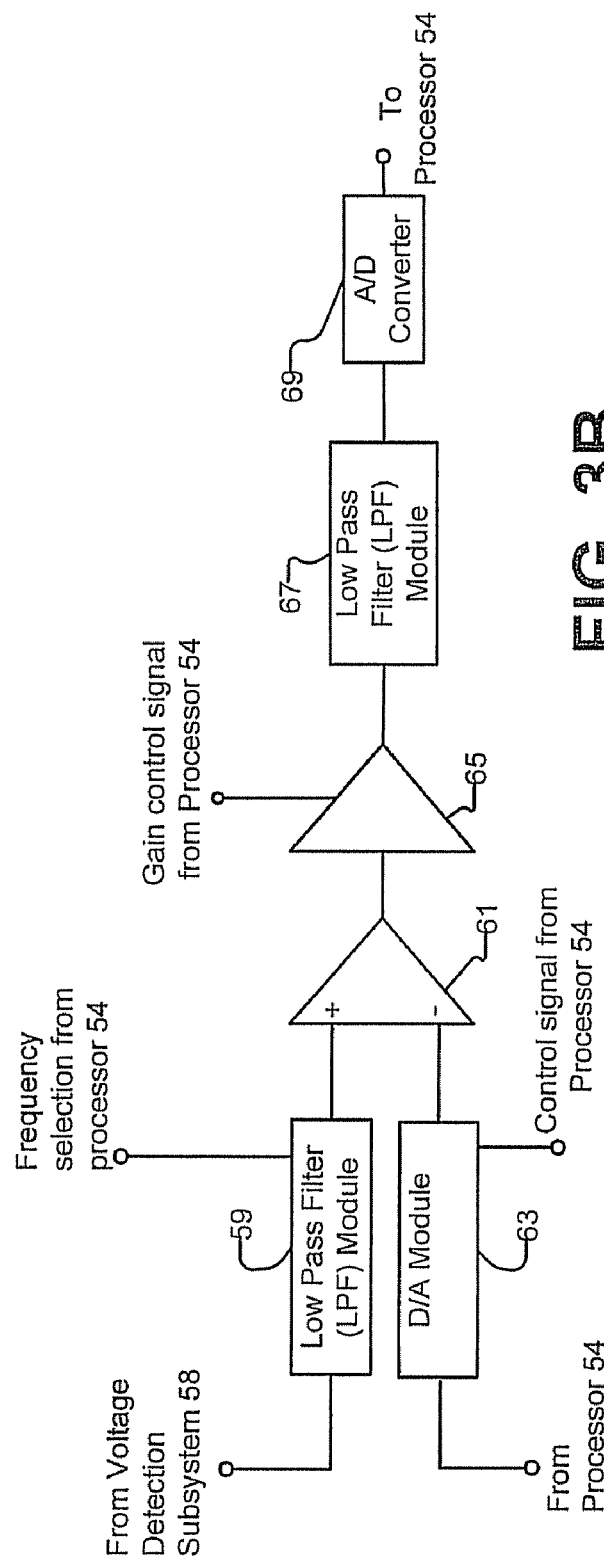
FIG. 3B is a block diagram of one embodiment of the level shifting, filtering and amplification subsystem of the battery tester of FIG. 3A.

Referring now to FIG. 3B, a block diagram shows one exemplary embodiment of the amplification module 52. The amplification module 52 may include a selectable low pass filter ("LPF") module 59 that filters the signal from multiplexer module 58. In one embodiment the LPF module 59 forms a filter that provides a cutoff frequency of between about 1 KHz and 50 KHz. In one specific embodiment the LPF filter module 59 forms a processor configurable filter having a cutoff frequency that is selectable between 1 kHz for voltage, current, intercell and intertier measurements, and 50 kHz for resistance measurements. The selection of the precise cutoff frequency is made via a control signal received from the processor 54.

An output of the LPF module 59 communicates with a first input (e.g. the non-inverting input) of an op-amp 61. A reference voltage may be applied to a second input (e.g., the inverting input) of the op-amp 61. The reference voltage may be generated by a digital-to-analog (D/A) module 63, which in one embodiment may form an 8-bit D/A module. D/A module 63 may be programmed by processor 54. An output of op-amp 61 generates a voltage based on the voltage difference across its first and second inputs. The signal to the first input of the op-amp 61 may be thought of as a "reduced bandwidth signal", as this signal has been filtered by the LPF module 50. The input signal applied to the second input of the op-amp 61 may be thought of as a reference signal, as this signal component is intended to help shift the level of the voltage signal measured by the multiplexer module 58. In one example D/A module 63 may apply a reference signal adapted to scale down the measured voltage signal by a predetermined factor, such as factor of four. When dealing with voltages, the output of the op-amp 61 may be thought of as a "level shifted voltage signal".

The D/A module 63 and the op-amp 61 operate to cooperatively selectively DC shift and/or amplify the reduced bandwidth signal that is provided by the LPF module 59. Shifting the reduced bandwidth signal is advantageous as this removes a portion of its DC voltage, which allows it to be subsequently amplified without over-ranging the A/D module 52a of the amplification module 52. Amplifying the reduced bandwidth signal also allows small voltage steps to be resolved with greater ease. The end result is that the dynamic range of a battery voltage step ΔV is increased, which allows for a greater A/D resolution (i.e., increased number of A/D counts) within the battery voltage step being analyzed.

The output or op-amp 61 may be applied to a programmable gain amplifier 65. The gain of amplifier 65 may be controlled by processor 54. In one embodiment the gain of the amplifier 65 may be selected by the processor 54 to be gains of 1, 10 or 40, to optimize the resulting voltage measurement. An output of amplifier 65 may be thought of as a "modified" voltage signal that may be filtered by a second LPF module 67. The modified voltage signal may be produced for both loaded and unloaded conditions of the battery under test. In some embodiments second LPF module 67 may be implemented as a fifth order Butterworth filter. The cutoff frequency may be 25 kHz. An output of second LPF module 67 communicates with an input of the A/D module 52a. In some embodiments the A/D module 52a may be a successive approximation register (SAR) ADC. The resolution of A/D module 52a may be 16 bits. The A/D module 52a communicates the A/D conversion results to the processor 54.

Figure 4:
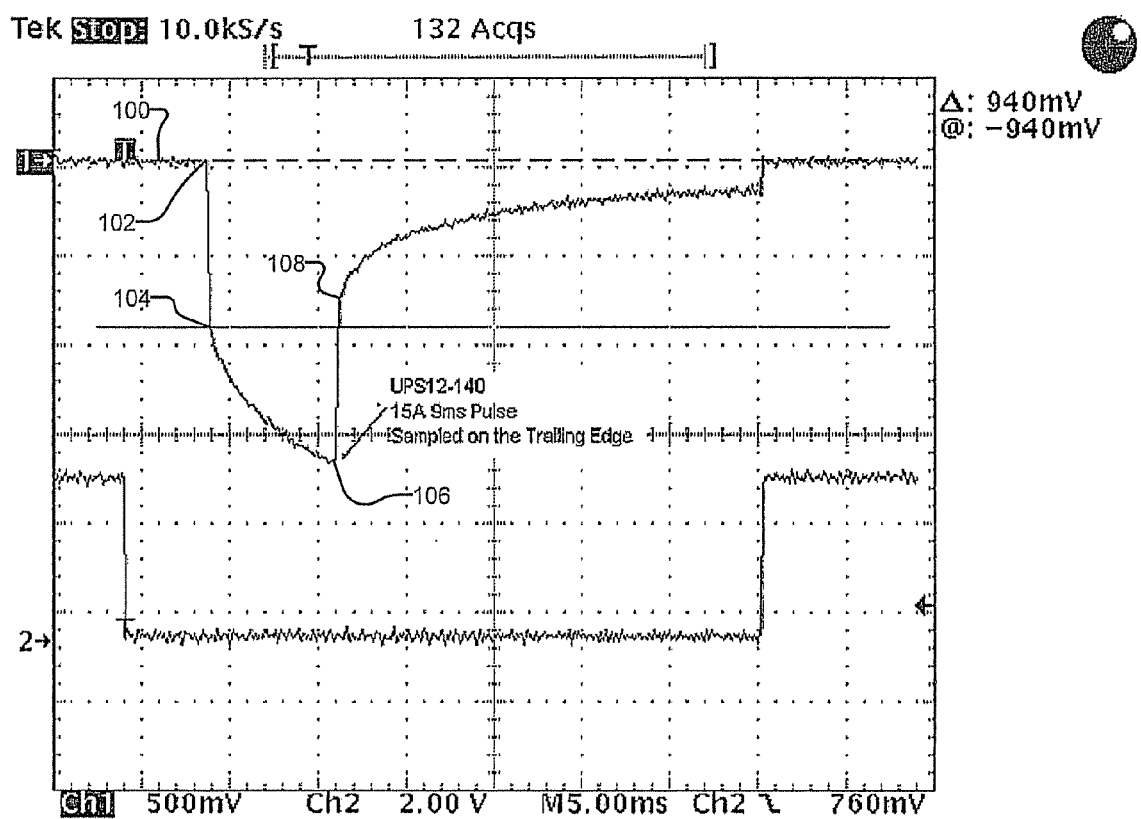
FIG. 4 is an oscilloscope trace showing an example of a voltage waveform that may appear across the battery under test while the battery tester of FIG. 3A performs a battery resistance test.

Referring now to FIG. 4, an oscilloscope trace shows an example of a voltage waveform that appears across the battery under test (e.g., battery 40-N) while battery tester 50 performs a battery resistance test. Trace 100 represents the battery voltage. At a time 102 load module 70 applies a load to battery string 42. In one example the load represents a pulse having a duration of 10 ms. It may also be advantageous to first sample the shunt voltage across the load resistance, and allow for a short time delay, for example about 5 ms, thereafter, to allow the multiplexer module 58 to settle.

When the load is coupled to the battery under test (e.g., battery 40-N), the battery voltage decreases at a first, rapid rate until a time 104. At time 104 the battery voltage begins to decrease at a slower rate than it did during the period between times 102 and 104. At a time 106 the processor 54 disconnects (i.e., "releases") the load module 70 from the battery string 42. From time 106 until a time 108 the battery voltage then increases at a first, rapid rate. At a time 108 the battery voltage begins to increase at a slower rate than it did during the period between times 106 and 108. The battery voltage continues to increase or recover after time 108.

The internal resistance of the battery under test can be estimated by ΔV/I, where ΔV is the difference between the voltages at times 102 and 104, respectively, or the differences between the voltages at times 106 and 108, respectively. Time 102 corresponds to the instant that the load is applied to the battery string 42 and time 106 coincides with the instant that the load is released (i.e., removed) from the battery string 42. Time 104 denotes that point in time where the voltage waveform transitions from its rapid rate of decline to the slower rate of decline. Time 108 denotes the point in time where the voltage waveform transitions from the rapid rate of increase to the slower rate of increase.

Figure 5:
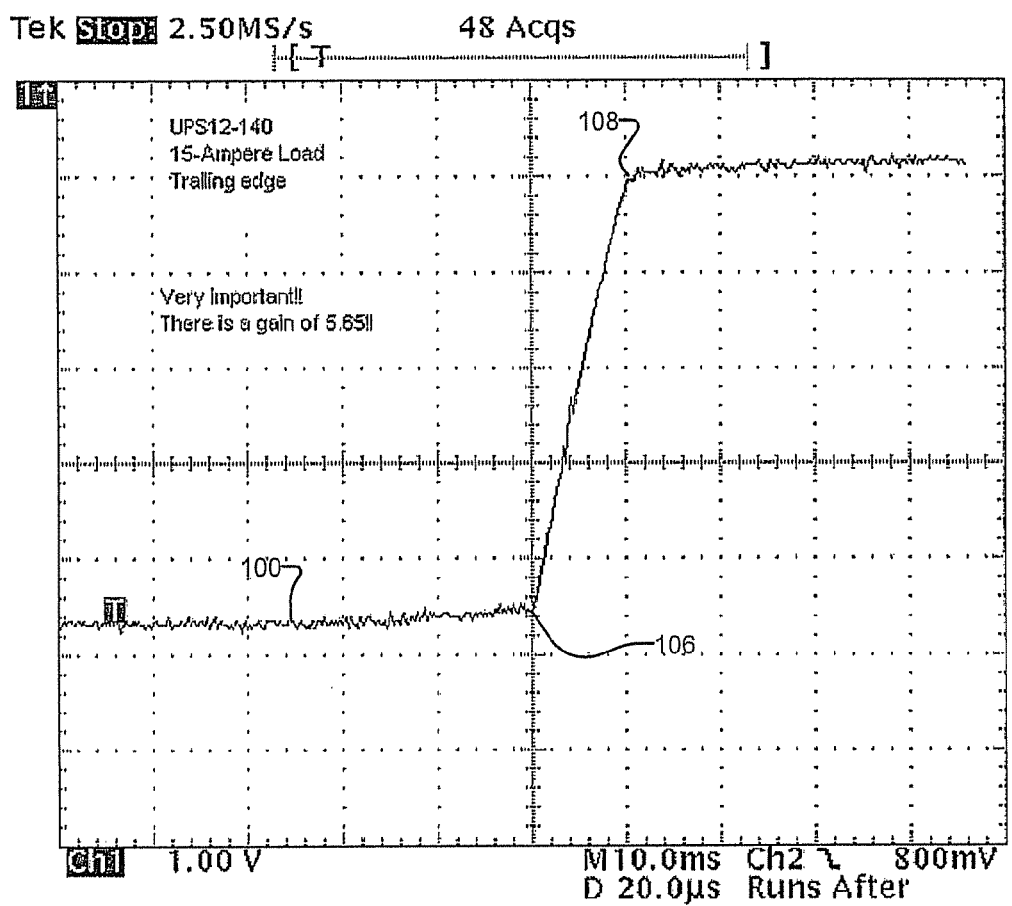
FIG. 5 is a magnified view of a portion of the oscilloscope trace shown in FIG. 4 illustrating in even greater detail the step portion of the voltage waveform that is analyzed by the battery tester of FIG. 1.

Referring now to FIG. 5, a view of the voltage waveform trace 100 of FIG. 4, magnified by a factor of 250, is shown. The highly magnified view shows in even greater detail the voltage "step" that is formed between the times 106 and 108, and the transition to the slower voltage increase beginning at time 108. It should be appreciated that the elapsed time between times 106 and 108 (and similarly the elapsed time between times 102 and 104) is expected to range from about 2 microseconds to about 400 microseconds, based on the type and quantity of batteries in battery string 42, and the state of health of batteries 40. The end result is that the dynamic range of the voltage "step" that is shown in FIGS. 4 and 5 is increased, which leads to greater A/D converter count disparities for smaller input voltage changes.

As one specific example of the potential performance of the battery tester 50, consider the application of a test current of 30A and a battery under test (40-N) having 100 u ohm of internal resistance. The measured voltage will be approximately 3 mV. Without the gain provided by the amplification module 52, the A/D module 52a would measure approximately 3 mV/62.5 uV, which would approximately equal 48 counts. This would be less than 1 count per micro-ohm. Including a gain of 40 in the transfer function of the amplification module 52 will significantly increase the number of counts per micro-ohm as follows:

(3 mv/62.5 uV)*40=1920 counts; and 1920 counts/100 u ohm=approximately 19.2 counts per micro-ohm, which sets the minimum detectable resolution to less than 1 micro-ohm.

It should also be appreciated that the method of estimating the battery resistance shown in FIGS. 4-5 is several times faster than the method of the prior art. The short duration of the load current allows load module 70 to employ smaller loads, i.e. having less thermal mass to absorb energy, than the prior art. Also, the short duration of the load current discharges the battery under test less than the prior art. The short duration of the load current also allows the battery resistance test of all batteries 40 to be completed in less time than when using methods of the prior art.

The short duration of the load current and the short duration of the elapsed time between times 106 and 108 (and similarly the elapsed time between times 102 and 104), requires a suitably fast A/D module 52a. In some embodiments A/D module 52a may be implemented with a successive approximation register (SAR) analog-to-digital converter. In some embodiments A/D module 52a provides a 16-bit result. The number of bits may be increased or decreased to increase and decrease resolution, respectively, of the battery resistance estimation.

Figure 6:
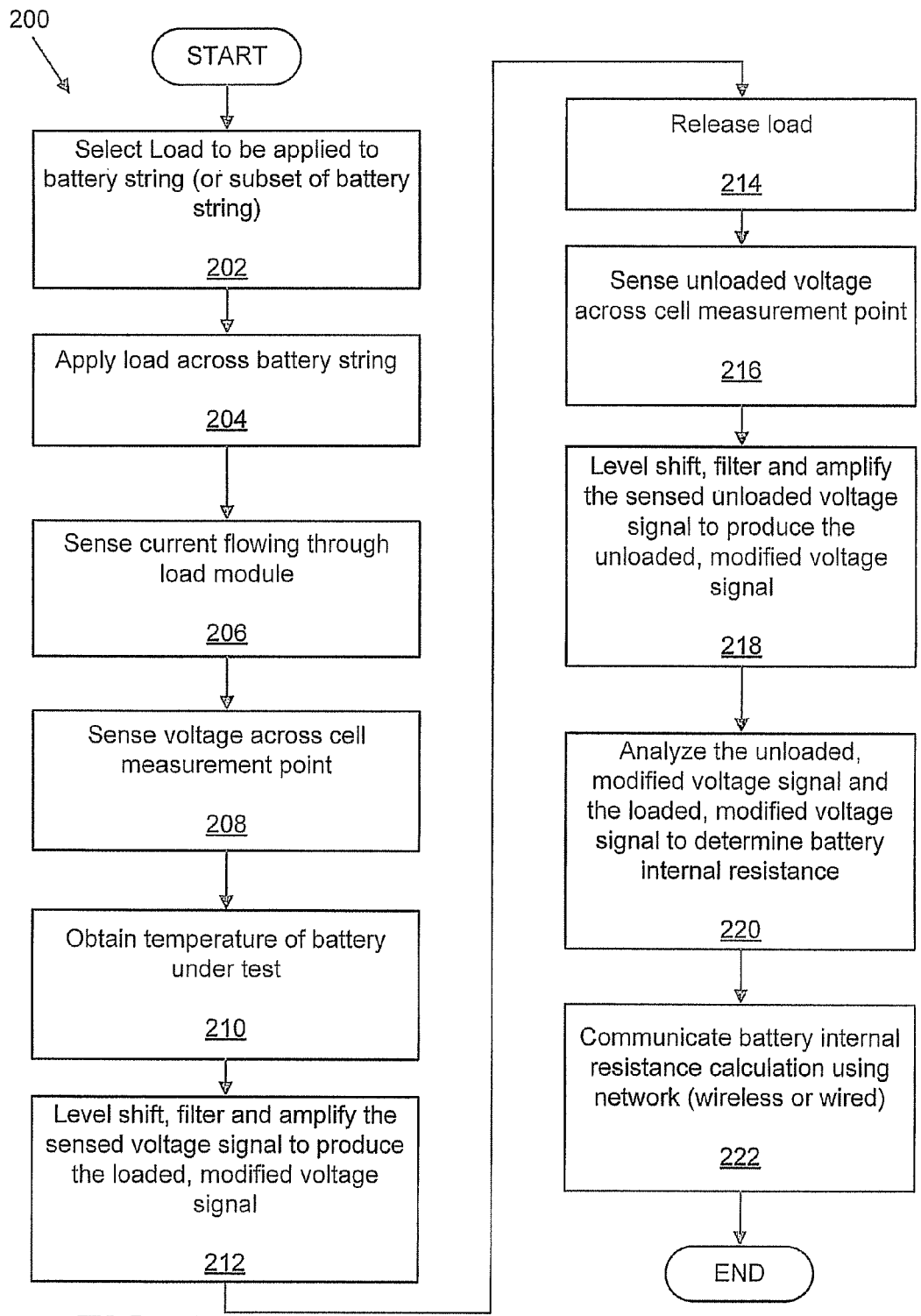
FIG. 6 is a flowchart showing operations that may be performed by the system of FIG. 3A.

Referring to FIG. 6, a flowchart 200 is illustrated that provides various operations that may be performed by the battery tester 50 during the operation of making a battery resistance determination. At operation 202 a load may be selected by the processor 54 that is to be applied to the battery string 42 (or alternatively to just a subset of batteries of the battery string 42). At operation 204 the selected load from the load module 70 may be applied across the battery string 42. At operation 206 the current flowing through the shunt resistor of the selected load may be sampled by the current sense module 72 and provided to the processor 54. At operation 208 the voltage across the battery cell measurement point is sensed by the multiplexer module 58. At operation 210 the temperature of the battery under test may be obtained from the temperature module 64. At operation 212 the amplification module 52 may perform the level shifting, filtering and amplification of the sensed voltage across the shunt resistor, to produce the loaded, modified voltage signal. At operation 214 the load may be released by the processor 54. At operation 216 the unloaded voltage across the battery cell measurement point may be obtained by the multiplexer module 58. At operation 218 the level shifting, filtering and amplification of the sensed voltage signal is again performed to produce the unloaded, modified voltage signal for the unloaded voltage measurement. At operation 220 the unloaded, modified voltage signal and the loaded, modified voltage signal may be analyzed by the processor 54 to determine the battery internal resistance. At operation 222 the battery internal resistance may be communicated by the processor 54 to an external subsystem (e.g., display) using one of the wired network module 62 or the wireless network module 60. Alternatively, the battery internal resistance may be saved for future analysis in the data archive 74.

Example embodiments have been provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

What is claimed is:

1. A system for measuring an internal resistance of a battery, the system comprising:
    a processor;
    a load module responsive to the processor for applying a load across the battery;
    a current sense subsystem for sensing the current flowing to the load module and generating a sensed current signal in accordance therewith; and
    a multiplexer subsystem in communication with the current sense subsystem for detecting voltages with the load module coupled across the battery and released from the battery, and generating voltage signals in accordance therewith; and
    a filtering and amplification subsystem responsive to said multiplexer subsystem, for filtering and amplifying a level of each of said voltage signals to produce a pair of modified voltage signals for use by said processor in determining said internal battery resistance of said battery.

2. The system of claim 1, wherein said load module comprises a configurable load module responsive to said processor for applying one of a plurality of different loads across said battery, depending upon a control signal applied to said load module.

3. The system of claim 1, wherein said multiplexer is responsive to said processor to output a selected one of said voltage signal and sensed current signal to said filtering and amplification subsystem.

4. The system of claim 1, wherein said filtering and amplification subsystem comprises a low pass filter for filtering said voltage signals and producing a voltage signal having a reduced bandwidth.

5. The system of claim 4, wherein said filtering and amplification subsystem further comprises a level shifting component for level shifting each of said voltage signals.

6. The system of claim 1, wherein:
    said filtering and amplification subsystem comprises a low pass filter for generating a reduced bandwidth voltage signals, and an amplifier responsive to said processor for amplifying said reduced bandwidth voltage signals in accordance with a predetermined gain, to generate said modified voltage signals; and
    said modified voltage signals form filtered, amplified voltage signals from which a step portion thereof may be analyzed by said processor.

7. The system of claim 1, wherein said predetermined gain comprises one of a plurality of different gains selected by said processor.

8. The system of claim 1, further comprising a temperature module for monitoring a temperature of said battery and providing a temperature signal to an input of said processor that is indicative of said temperature of said battery.

9. The system of claim 1, further comprising a power supply module for filtering a signal from said battery that is used to power said system.

10. The system of claim 9, further comprising an independent battery for supplying power to said power supply module 76.

11. The system of claim 1, wherein said modified voltage signals define a magnified portion of a voltage step formed as said battery recovers after said load has been applied to said battery.

12. The system of claim 1, further comprising at least one of:
    a wireless network module for communicating an output of said processor relating to said internal resistance of said battery; and
    a wired network module for communicating an output of said processor relating to said internal resistance of said battery.

13. The system of claim 12, further comprising a data archive for storing information generated by said processor pertaining to said internal resistance of said battery.

14. A system for measuring an internal resistance of a battery, the system comprising:
- a processor;
- a load module responsive to the processor for applying a load across the battery;
- a current sense subsystem for sensing the current flowing to the load module and generating a sensed current signal in accordance therewith; and
- a multiplexer module in communication with the current sense subsystem for detecting voltages across the load module and generating a pair of voltage signals in accordance therewith, one with the load coupled across the battery and one without the load coupled across the battery; and
- a level shifting, filtering and amplification subsystem responsive to said multiplexer module and said current sense subsystem, that:
- filters said voltage signals to reduce a bandwidth of each said voltage signal, to thus produce reduced bandwidth voltage signals;
- level shifts said reduced bandwidth voltage signals to produce level shifted voltage signals; and
- amplifies said level shifted voltage signals to produce a pair of modified voltage signals, and wherein said modified voltage signals form an amplified portion of a voltage step of said level shifted voltage signal as said battery recovers after said load has been applied to said battery.

15. The system of claim 14, wherein said load module comprises a configurable load module responsive to said processor for applying one of a plurality of different loads across said battery, depending upon a control signal applied to said load module by said processor.

16. The system of claim 14, further comprising at least one of:
- a temperature module for sensing a temperature of said battery and providing a related signal to said processor; and
- a memory for storing information used by said processor during operation of said system.

17. The system of claim 14, wherein said level shifting, filtering and amplification subsystem comprises:
- a low pass filter for filtering said voltage signals to produce reduced bandwidth voltage signals; and
- a variable gain amplifier controlled by a gain signal from said processor.

18. The system of claim 14, further comprising at least one of:
- a wireless network module for communicating an output of said processor relating to said internal resistance of said battery; and
- a wired network module for communicating an output of said processor relating to said internal resistance of said battery.

19. The system of claim 14, further comprising at least one of:
- an independent battery for providing power to said system; and
- a data archive for storing information relating to said internal battery resistance for future use.

20. A method for measuring an internal resistance of a battery, the method comprising:
- applying a load across a pair of terminals of said battery;
- sensing a current flowing through said load and generating a sensed current signal in accordance therewith;
- measuring a change in voltage across said battery to produce a while the load is applied across the battery and while the load is released from the battery, to generate a pair of voltage signals;
- filtering said voltage signals to produce reduced bandwidth voltage signals;
- level shifting the reduced bandwidth voltage signals to produce shifted voltage signals;
- amplifying the shifted voltage signal to produce amplified voltage signals; and
- using the amplified voltage signals and said sensed current signal to calculate said internal resistance of said battery.

* * * * *

UNITED STATES PATENT AND TRADEMARK OFFICE
CERTIFICATE OF CORRECTION

| | | |
|---|---|---|
| PATENT NO. | : 8,063,643 B2 | Page 1 of 1 |
| APPLICATION NO. | : 12/367783 | |
| DATED | : November 22, 2011 | |
| INVENTOR(S) | : Edward Winsor Deveau et al. | |

It is certified that error appears in the above-identified patent and that said Letters Patent is hereby corrected as shown below:

In The Specification

Column 2,
Line 63, "is shown" should be --as shown--.

In The Claims

Column 8,
Line 29, claim 6, after "generating", delete "a".

Column 10,
Lines 26-27, claim 20, after "produce", delete "a" and insert --,--.
Line 28, claim 20, after "battery,", delete "to generate".

Signed and Sealed this
Fourteenth Day of June, 2016

Michelle K. Lee
*Director of the United States Patent and Trademark Office*